(12) United States Patent
Bellows

(10) Patent No.: US 7,631,154 B2
(45) Date of Patent: *Dec. 8, 2009

(54) HANDLING OF THE TRANSMIT ENABLE SIGNAL IN A DYNAMIC RANDOM ACCESS MEMORY CONTROLLER

(75) Inventor: Mark David Bellows, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 7 days.

This patent is subject to a terminal disclaimer.

(21) Appl. No.: 11/849,548

(22) Filed: Sep. 4, 2007

(65) Prior Publication Data

US 2008/0046620 A1 Feb. 21, 2008

Related U.S. Application Data

(63) Continuation of application No. 10/970,458, filed on Oct. 21, 2004, now Pat. No. 7,275,137.

(51) Int. Cl.
G06F 12/00 (2006.01)
(52) U.S. Cl. ..................................................... 711/154
(58) Field of Classification Search ................... 711/154, 711/5, 105
See application file for complete search history.

(56) References Cited

U.S. PATENT DOCUMENTS

| 5,884,067 A | 3/1999 | Storm et al. |
| 6,151,658 A | 11/2000 | Magro |
| 6,295,593 B1 | 9/2001 | Hsu et al. |
| 6,400,715 B1 * | 6/2002 | Beaudoin et al. ............ 370/392 |
| 6,421,754 B1 | 7/2002 | Kau et al. |
| 2006/0090043 A1 | 4/2006 | Bellows |
| 2006/0123187 A1 | 6/2006 | Bellows et al. |

* cited by examiner

*Primary Examiner*—Pierre-Michel Bataille
(74) *Attorney, Agent, or Firm*—Stephen R. Tkacs; Stephen J. Walder, Jr.; Matthew B. Talpis

(57) ABSTRACT

A mechanism provided for controlling a transmission enable (TX_ENA) signal. The mechanism generates a queue of bits to track a sequence of commands and provides the transmit enable signal if the queue is empty. If an entry at a top of the queue indicates a write command, the mechanism provides the transmit enable signal for a predetermined number of cycles before the transmit enable signal is needed and until write data associated with the entry is transmitted, whereupon the entry is removed from the queue. If the entry at the top of the queue does not indicate a write command, the mechanism discontinues the transmit enable signal and removing the entry from the queue.

19 Claims, 4 Drawing Sheets

HANDLING OF THE TRANSMIT ENABLE SIGNAL IN A DYNAMIC RANDOM ACCESS MEMORY CONTROLLER

This application is a continuation of application number 10/970,458, filed Oct. 21, 2004, status awaiting publication now U.S. Pat. No. 7,275,137.

FIELD OF THE INVENTION

The present invention relates generally to data transmission control, and more particularly, to data transmission control in a memory controller.

DESCRIPTION OF THE RELATED ART

With Extreme Data Rate (XDR™) DRAMs, available from Rambus, Inc., El Camino Real, Los Altos, Calif. 94022, data rate transfers for memory has been dramatically increased. Such features as an octal data rate, which allows for 8 bits of data transmission per cycle, to allow for such increases in speed. Accordingly, the operation of the XDR™ DRAMs require certain propagation and turn-on times to function. As with any DRAM, and its associated control logic, certain periods of time are between activation and data transmission for either reads or writes. Additionally, some DRAMs can require a certain delay requirements. Specifically, XDR™ DRAMs require a minimum of 2 cycles between transition of the Transmission Enable (TX_ENA) and actual data transmission (TDATA). XDR™ DRAMs also require that if the TX_ENA signal toggles to logic low then TX_ENA should remain logic low for a minimum of 4 cycles. Any deviation from these specifications can result in data error and/or data corruption.

Referring to FIG. 1 of the drawings, the reference numeral 100 generally designates a non-operational write for an XDR™ DRAM. Depicted in FIG. 1 are both TX_ENA signals and TDATA signals.

At $t_0$, both TDATA and TX_ENA are logic low, signifying no data transmission. Then, at $t_1$, TX_ENA transitions to logic high indicating that at some point in the near future that data will be transmitted to the XDR™ DRAM. However, as a result of the design of the XDR™ DRAM, no data can be transmitted before $t_3$. TDATA, though, begins transmitting a first write of data at $t_3$, so there was not a violation. Data is then continually transmitted until $t_7$, where both TDATA and TX_ENA transition to logic low.

In anticipation of a second write of data, TX_ENA transition to logic high again. TDATA is slotted to transmit data at $t_{10}$, at least requiring TX_ENA to transition to logic high at $t_8$ or earlier. However, since TX_ENA has transitioned to logic low at $t_7$ and is forced to transition back to logic high at $t_8$, a problem exists. XDR™ DRAMs require a turn-off time of TX_ENA for a minimum of 4 clock cycles. However, this XDR™ DRAM specification is violated because TX_ENA remains off for only 1 cycle.

Therefore, there is a need for a method and/or apparatus for better controlling TX_ENA signals in anticipation of data transmission that addresses at least some of the problems associated with conventional memory control.

SUMMARY OF THE INVENTION

In one illustrative embodiment, a method for handling a transmit enable (TxEna) signal in a memory controller comprises generating a queue of bits to track a sequence of commands, providing the transmit enable signal if the queue is empty, and if an entry at a top of the queue indicates a write command, providing the transmit enable signal for a predetermined number of cycles before the transmit enable signal is needed and until write data associated with the entry is transmitted, whereupon on the entry is removed from the queue. If the entry at the top of the queue does not indicate a write command, the method comprises discontinuing the transmit enable signal and removing the entry from the queue.

In another illustrative embodiment, an a apparatus is provided for handling a transmit enable signal in a memory controller. The apparatus comprises transmit enable logic that is configured to provide the transmit enable signal at least for a predetermined number of cycles and for the duration of a write and control logic that provides a feedback signal to the transmit enable logic. The transmit enable logic has at least one feedback loop. The control logic is configured to assert the feedback signal if a next memory command in a sequence of memory commands is a write. The transmit enable logic is configured to keep the transmit enable signal asserted after the number of cycles if the feedback signal asserted.

In another illustrative embodiment, a method for providing a transmit enable signal in a memory controller comprises asserting a transmit enable signal for a predetermined number of cycles, providing a feedback signal based on a sequence of memory commands, and deasserting the transmit enable signal responsive to non-write memory command and the feedback signal being deasserted such that the transmit enable signal remains asserted if the feedback signal is asserted.

These and other features and advantages of the present invention will be described in, or will become apparent to those of ordinary skill in the art in view of, the following detailed description of the example embodiments of the present invention.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
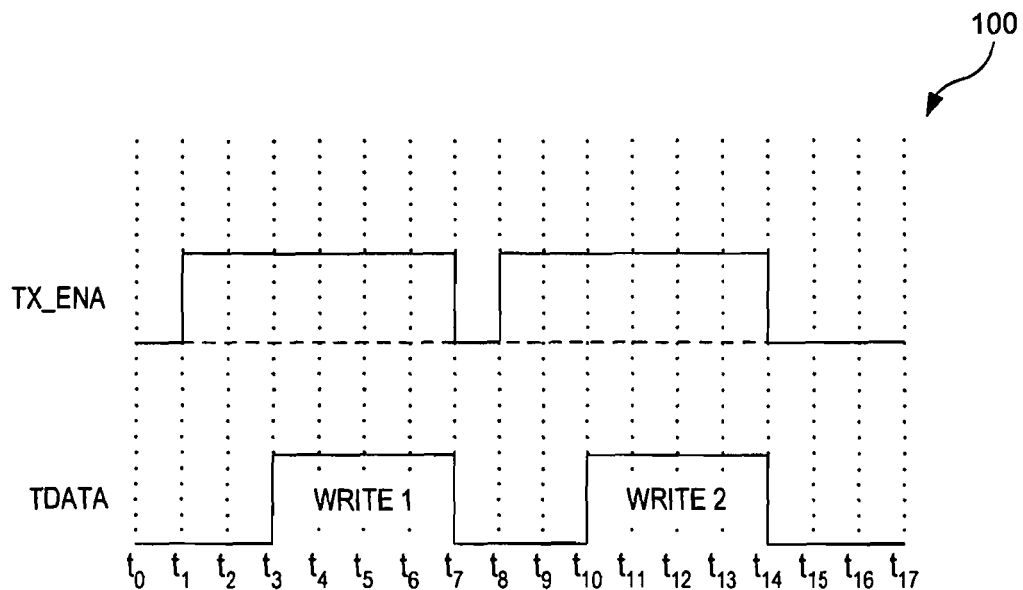
FIG. 1 is a timing diagram depicting a non-operational write.
Figure 2:
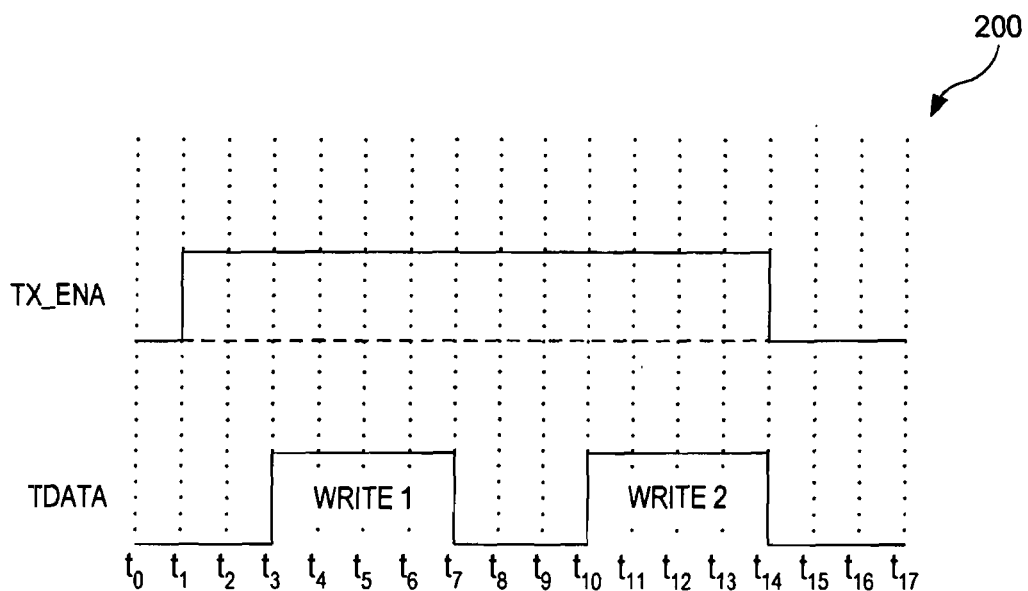
FIG. 2 is a timing chart depicting an operational write.

Referring to FIG. 2 of the drawings, the reference numeral 200 generally designates a timing diagram depicting operational writes for TX_ENA. Depicted in FIG. 1 are both TX_ENA signals and TDATA signals.

At $t_0$, both TDATA and TX_ENA are logic low, signifying no data transmission. Then, at $t_1$, TX_ENA transitions to logic high indicating that at some point in the near future that data will be transmitted to the XDR™ DRAM. However, as a result of the design of the XDR™ DRAM, no data can be transmitted before $t_3$. TDATA, though, begins transmitting a first write of data at $t_3$, so there was not a violation. Data is then continually transmitted until $t_7$, where TDATA transition to logic low.

In anticipation of a second write of data, TX_ENA remains at logic high again. TDATA is slotted to transmit data at $t_{10}$, at least requiring TX_ENA to transition to logic high at $t_8$ or earlier. However, since TX_ENA remains at logic high, data can be safely transmitted. XDR™ DRAMs require a turn-off time of TX_ENA for a minimum of 4 clock cycles, which has been eliminated as a potential barrier.

Figure 3:
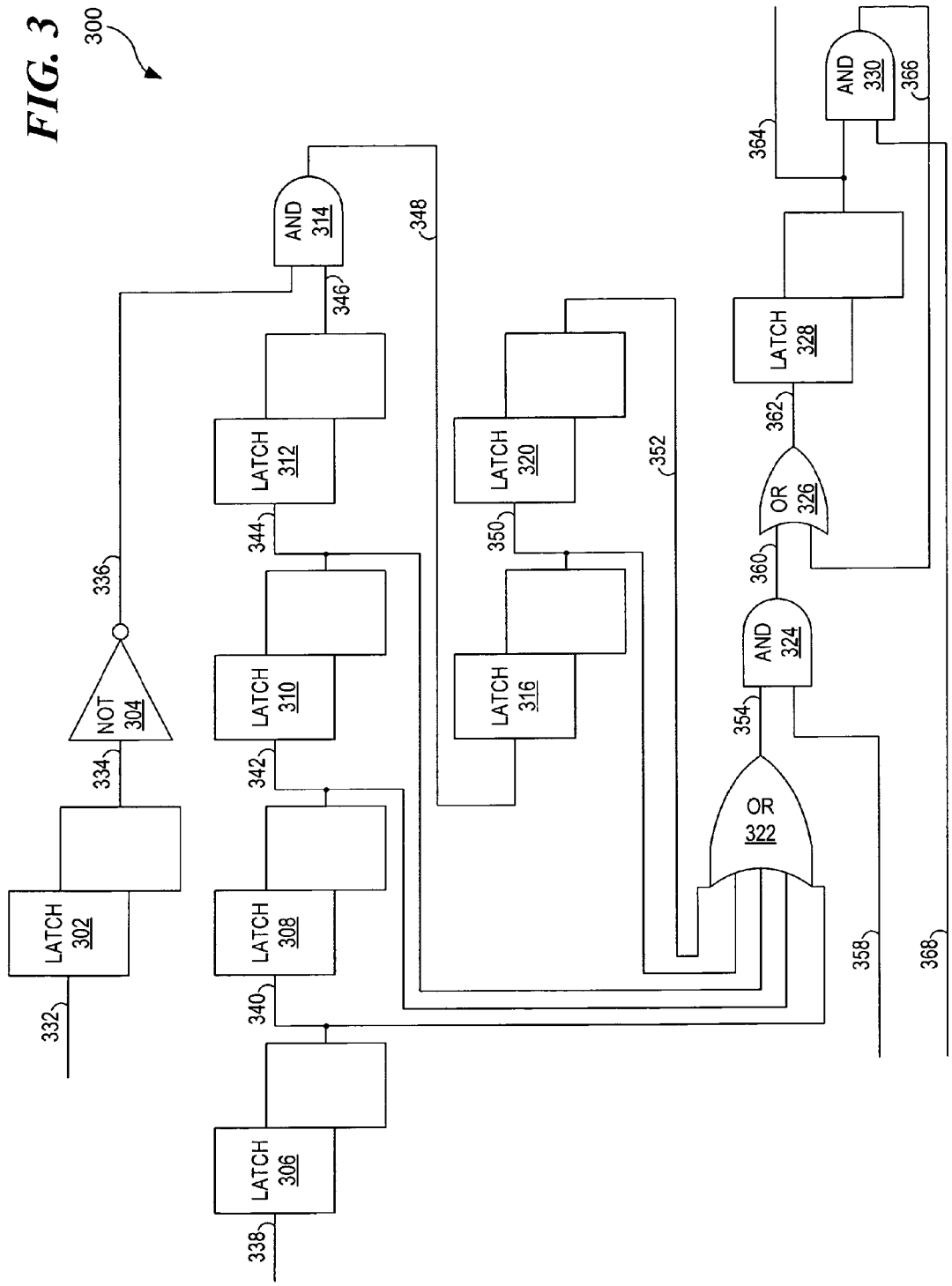
FIG. 3 is a block diagram depicting TX_ENA logic.

To accomplish such a task of anticipating additional future writes, however, additional logic is added. Referring to FIG. 3 of the drawings, the reference numeral 300 generally designates a block diagram depicting TX_ENA logic. The TX_ENA logic 300 comprises eight latches 302, 306, 308, 310, 312, 316, 320, and 328, an inverter 304, three AND gates 314, 324, and 330, and two OR gates 322 and 326.

When initiated, signals are transmitted through communication channels 338 to the latch 306. A start enable signal is transmitted to the latch 306. This initial signal allows for the process to begin whereby TX_ENA can transition to logic high in anticipation of data being written to the DRAMs (not shown).

Once the initial data has been transmitted to the latch 306, the latches 308, 310, and 312 are arranged in a cascade configuration to forward the results of the initial signal. The output of the latch 306 is transmitted to the latch 308 and the OR gate 322 through the communication channel 340. The output of the latch 308 is transmitted to the latch 310 and the OR gate 322 through the communication channel 342. The output of the latch 310 is transmitted to the latch 312 and the OR gate 322 through the communication channel 344. By propagating the initial signal from the communication channel 338, a delay occurs with each propagation. Therefore, the output of the OR gate reflects the result of the initial signal as the signal propagated through the latches The output of the cascaded latches 306, 308, 310, and 312 is the input to the AND gate 314. Specifically, the output of the latch 312 is transmitted to the AND gate 314 through the communication channel 346. In addition to initial signal transmitted to the cascaded latches 306, 308, 310, and 312, a signal can be transmitted to the latch 302, as a register configure signal through communication channel 332. A configuration signal is then output to the inverter 304 through the communication channel 334. The inverted signal is then transmitted to the AND gate 314 through communication channel 336. The result of the ANDed inverted signal and the propagated signal is to allow for TX_ENA to enable the proper registers.

After the initial signals have been propagated and ANDed, another set of cascaded latches is employed. The latches 316 and 320 are arranged in a cascaded fashion such that the output of the AND gate 314 is input into the latch 316. The ANDed signal is transmitted to the latch 316 through the communication channel 348. The latch 316 then propagates the ANDed signal to the latch 320 and the OR gate 322 through the communication channel 350. The latch 320 the outputs a signal to the OR gate 322 through communication channel 352. Hence, the OR gate reflects the proper TX_ENA for the correct register.

Based on the output of OR gate 322, the TX_ENA transitions to or remains logic high. The OR gate outputs a signal to the AND gate 324 through the communication channel 354. The AND gate 324 ANDs the resultant OR signal with the inverted Drive Complete Enable (DriveCmpEn) that is communicated to the AND gate 324 through the communication channel 358. The DriveCmpEn signal can be overwritten by a state bit so that, when a last enable pulse is received, the mode can be switched from TX_ENA to Compare Enable (CMP_ENA). Therefore, the result from the AND gate 324 can be determinative of the state of the system as to whether TX_ENA is logic high or logic low.

The output of AND gate 324 is then transmitted to a feedback loop. The feedback loop comprises the OR gate 326, the latch 328, and the AND gate 330. The OR gate 326 receives the output of the AND gate 324 through the communication channel 360. The OR gate 326 then feeds the latch 328 through the communication channel 362. The output of the latch 328 is the TX_ENA signal output through the communication channel 364. The TX_ENA signal is then ANDed at the AND gate 330 with a feedback signal transmitted through the communication channel 368. The ANDed output is then fed back to the OR gate 326 through the communication channel 366. Therefore, the TX_ENA signal can be transitioned to logic low based on the logic states of the feedback signal and the output of the AND gate 324 transmitted through the communication channels 368 and 360, respectively.

Figure 4:
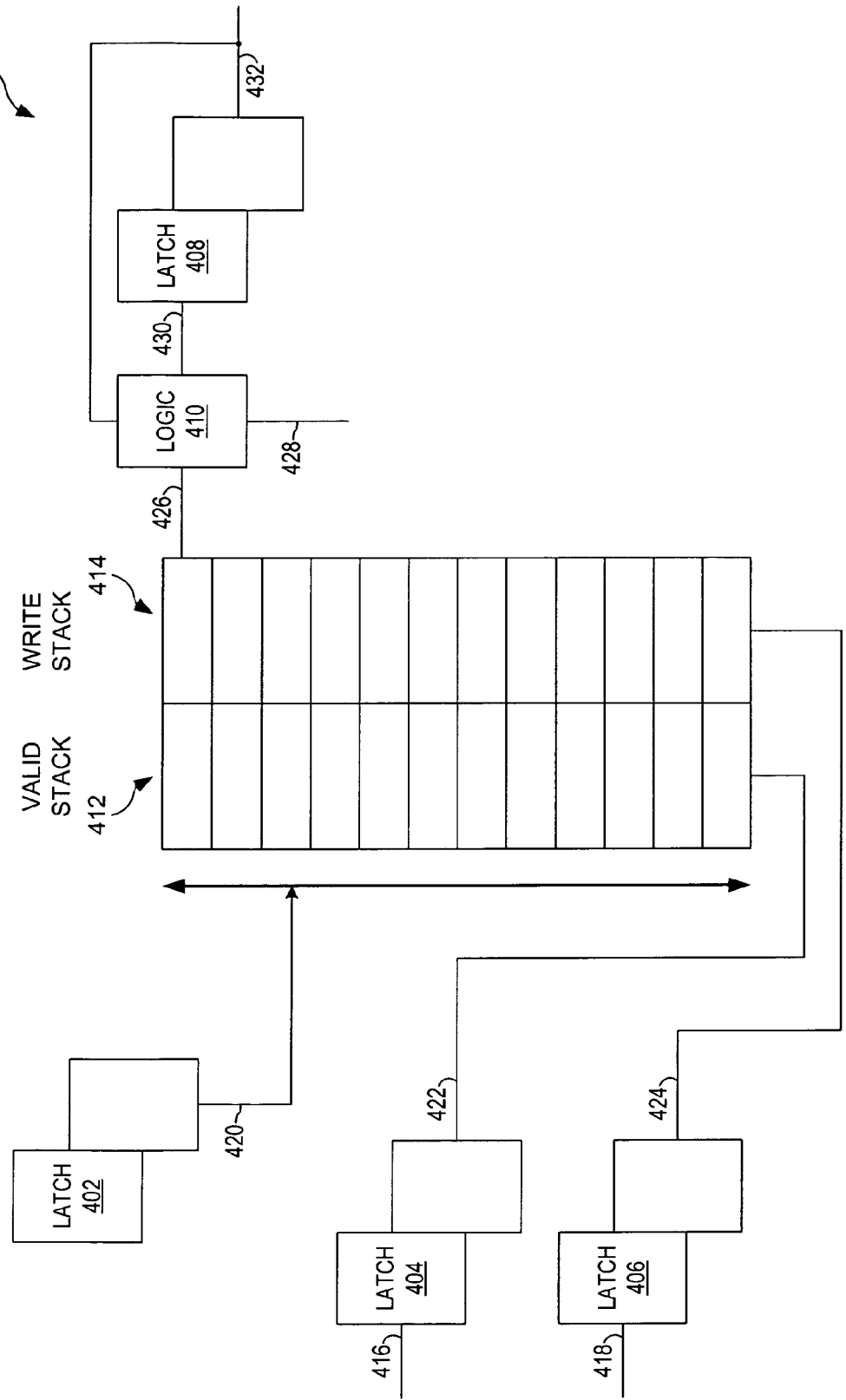
FIG. 4 is a block diagram depicting command logic for the TX_ENA logic.

The feedback signal, then, can be a significant factor in the operation of the TX_ENA logic 300. Referring to FIG. 4 of the drawings, the reference numeral 400 generally designates command logic for the TX_ENA logic. The command logic 400 provides the feedback signal to the communication channel 368. The command logic comprises four latches 402, 404, 406, and 408, control logic 410, a valid queue 412, and a write queue 414.

The command logic 400 receives and stores new command and write entries for execution and provides the enabling output to indicate whether the TX_ENA should be logic high or logic low. New command operations are received at the latch 404 through the communication channel 416. New write data corresponding to each new operation are transmitted to the latch 406 through the communication channel 418. The new operations and new write data are transmitted from the latch 404 and the latch 406 to the valid queue 412 and the write queue 414 through the communications channels 422 and 424, respectively.

At the bottom of the queues 412 and 414 is pointing logic, which is the latch 402. Through the communication channel 420, the latch 402 indicates the next command to be recorded is stored. Effectively, there is no specific pointer, however, as is common with queues.

The control logic 410 then utilizes the available data to generate the feedback signal to the TX_ENA logic 300. Data from the valid queue 412 and the write queue 414 indicating the condition of the respective queues is transmitted to the control logic 410 through the communication channel 426. The control logic 410 also receives a start initialization signal through the communication channel 428, which is equivalent to the communication channel 344 of FIG. 3. In attempting to generate control data, the control signal also employs the DriveCmpEn signal, which is the inverted signal transmitted by the communication channel 358 of FIG. 3. The output of the control logic 410 is then communicated to the latch 408 through the communication channel 430, which then outputs a feedback signal through the communication channel 432. The feedback signal is transmitted to the control logic 410 as well as to the logic gate 330 of FIG. 3 because the communication channel 432 is equivalent to the communication channel 368 of FIG. 3.

Under certain conditions, the control logic 410 provides the control data necessary to generate a logic high TX_ENA signal. To provide such a signal, the start initialization signal is '1' or logic high, and the DriveCmpEn is '0' or logic low. Also, the value from the valid queue 412 is '1,' while the value from the write queue 414 is '1.' Under other conditions, though, where the value from the valid queue 412 is '1' and the value from the write queue 414 is '0,' the feedback loop will be terminated. Essentially, the queues 412 and 414 are received. In other words, when the value from the valid queue 412 is '1' and the value from the write queue 414 is '0,' a read operation is the commanded operation that requires TX_ENA to transition to logic low.

Therefore, the valid queue 412 and the write queue 414 assist in preventing the hardware from violating the predetermined criteria. Effectively, as soon as a read, a write, or a calibration event occurs, the event is logged in the queues 412 and 414. However, only a write will enable a logic high or '1' output value for the write queue 414, while the remaining event types will reflect a logic low or '0.' When a write reaches the top of the queues 412 and 414 and is executed, the feedback path is left open. Additionally, the TX_ENA is driven for 6 cycles from the latches 306, 308, 310, 312, 316, and 320 of FIG. 3 and until something kills the feedback loop.

Figure 5:
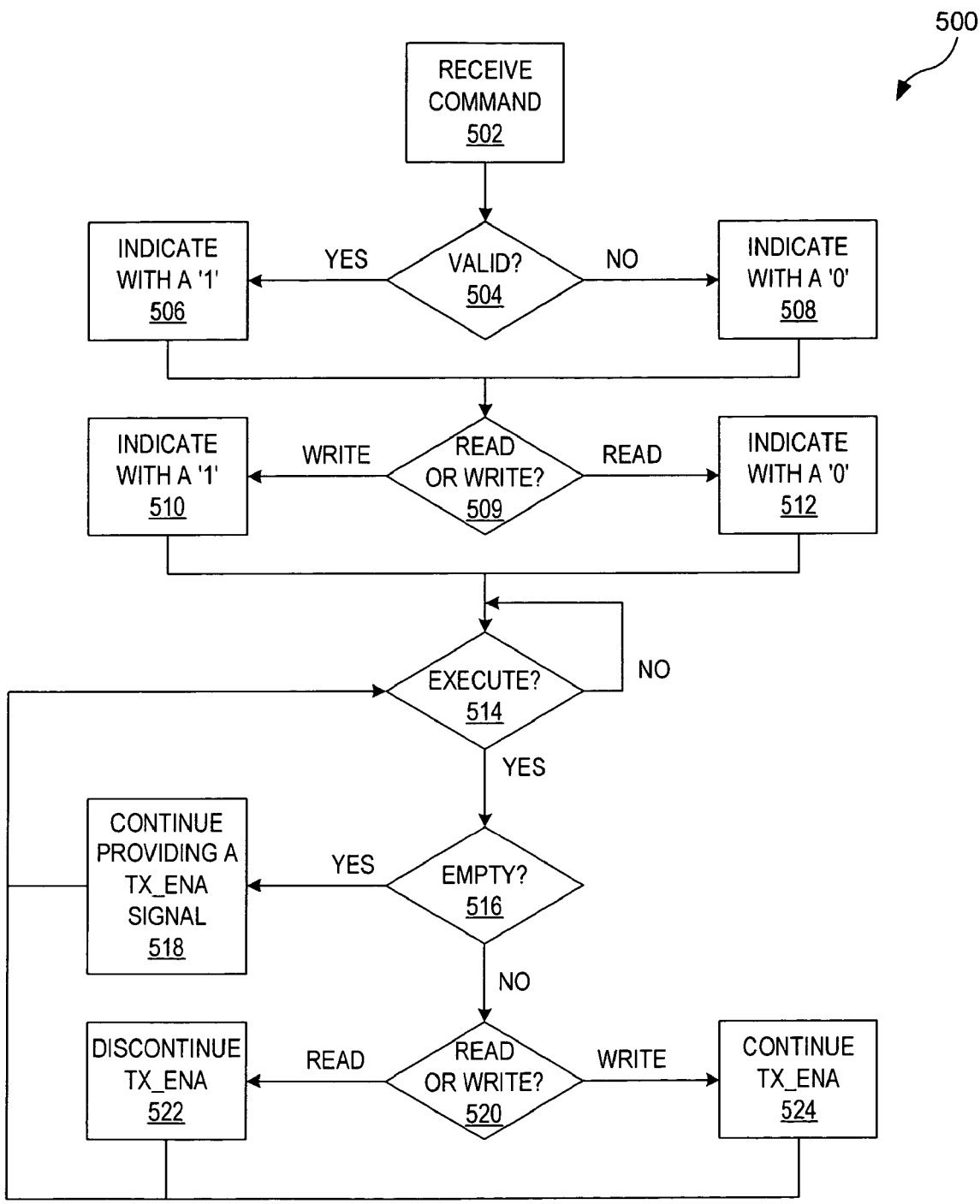
FIG. 5 is a flow chart depicting the operation of the TX_ENA logic and the TX_ENA command logic.

The TX_ENA logic 300 and the TX_ENA control logic 400 do, however, operate in conjunction to provide cohesive control of the TX_ENA signal. Referring to FIG. 5 of the drawings, the reference numeral 500 generally designates a flow chart depicting the operation of the TX_ENA logic 300 and the TX_ENA control logic 400.

Initially, commands are issued to XDRAMs. When a command is received in step 502, an analysis of the commands begins. A determination is made in step 504 as to whether the command is valid or invalid. If the command is valid, then in step 506 a '1' is written into the valid queue 414. However, if the command is not valid, then in step 508 a '0' is written into the valid queue 414. Once the validity has been determined, then in step 509 the command is analyzed to determine whether it is a read or a write command. If the command is a write command, then in step 510 a '1' is written into the write queue 414. Also, if the command is a read command, then in step 512 a '0' is written into the write queue 414.

After commands have been accounted for in the queues 412 and 414, the system waits for execution in step 514. A determination is then made in step 516 as to whether the queues are empty. If the queues are empty, then in step 514 the system 300 and 400 continues to provide a TX_ENA signal and waits for another execution. Otherwise, a determination is made in step 520 as to whether the command at the top of the queues is a read command or a write command. If the command is a read command, the TX_ENA signal is discontinued in step 522, but if the command is a write command, then the TX_ENA signal is continued in step 524. After execution is complete of either a read or write signal, the system 300 and 400 waits for another execution in step 514.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for handling a transmit enable (TxEna) signal in a memory controller, comprising:

generating a queue of bits to track a sequence of commands;

providing the transmit enable signal if the queue is empty;

if an entry at a top of the queue indicates a write command, providing the transmit enable signal for a predetermined number of cycles before the transmit enable signal is needed and until write data associated with the entry is transmitted, whereupon the entry is removed from the queue; and if the entry at the top of the queue does not indicate a write command, discontinuing the transmit enable signal and removing the entry from the queue.

2. The method of claim 1, wherein the step of providing the transmit enable signal for a predetermined number of cycles further comprises latching indicia of the write command for the predetermined number of times to drive the transmit enable signal.

3. The method of claim 1, the step of generating a queue of bits to track a next command in a sequence further comprises:
generating a valid queue of valid bits to indicate validity of the commands in the sequence; and
generating a write queue of write bits to indicate whether the commands in the sequence are either a read command or a write command.

4. The method of claim 3, wherein the method further comprises determining if a next command in the sequence is a read command or a write command.

5. The method of claim 4, wherein the step of determining further comprises indicating that the next command is a write command if a value of the top of the valid queue is '1' and a value of the top of the write queue is '1'.

6. The method of claim 4, wherein the step of determining further comprises indicating that the next command is a read command if a value of the top of the valid queue is '1' and a value of the top of the write queue is '0'.

7. A method for providing a transmit enable signal in a memory controller, the method comprising:
asserting a transmit enable signal for a predetermined number of cycles;
providing a feedback signal based on a sequence of memory commands; and
deasserting the transmit enable signal responsive to non-write memory command and the feedback signal being deasserted such that the transmit enable signal remains asserted if the feedback signal is asserted.

8. The method of claim 7, wherein providing the feedback signal comprises:
generating a queue of bits to track the sequence of memory commands;
asserting the feedback signal if the queue is empty;
if an entry at a top of the queue indicates a write command, providing the feedback and removing the entry from the queue; and
if the entry at the top of the queue does not indicate a write command, deasserting the feedback signal and removing the entry from the queue.

9. The method of claim 8, wherein generating a queue of bits further comprises:
generating a valid queue of valid bits to indicate validity of the commands in the sequence; and
generating a write queue of write bits to indicate whether the commands in the sequence are either a read command or a write command.

10. The method of claim 9, wherein the method further comprises determining if a next command in the sequence is a read command or a write command.

11. The method of claim 10, wherein determining if a next command in the sequence is a read command or a write command further comprises determining that the next command is a write command if a value of the top of the valid queue is '1' and a value of the top of the write queue is '1'.

12. The method of claim 10, wherein determining if a next command in the sequence is a read command or a write command further comprises indicating that the next command is a read command if a value of the top of the valid queue is '1' and a value of the top of the write queue is '0'.

13. The method of claim 7, wherein asserting the transmit enable signal for a predetermined number of cycles further comprises latching the transmit enable signal for the predetermined number of cycles.

14. An apparatus for handling a transmit enable signal in a memory controller, comprising:
transmit enable logic that is configured to provide the transmit enable signal at least for a predetermined number of cycles and for the duration of a write; and
control logic that provides a feedback signal to the transmit enable logic,
wherein the transmit enable logic has at least one feedback loop, wherein the control logic is configured to assert the feedback signal if a next memory command in a sequence of memory commands is a write, and wherein the transmit enable logic is configured to keep the transmit enable signal asserted after the number of cycles if the feedback signal is asserted.

15. The apparatus of claim 14, wherein the transmit enable logic further comprises a plurality of latches to provide the transmit enable signal for the predetermined number of cycles.

16. The apparatus of claim 14, wherein the at least one feedback loop further comprises feedback control logic that is configured to terminate the at least one feedback loop if a next command in the sequence indicates a read command.

17. The apparatus of claim 14, wherein the control logic further comprises at least one queue of bits that is configured to indicate characteristics of memory commands within the sequence.

18. The apparatus of claim 17, wherein the at least one queue further comprises:
a valid bit queue to indicate the validity of memory commands within the sequence; and
a write bit queue to indicate whether the memory commands within the sequence are read command or are write commands.

19. The apparatus of claim 18, wherein the at least one feedback loop further comprises feedback control Logic that is configured to terminate the at least one feedback loop if a next command in the sequence indicates a read command with '0' in the write bit queue.

* * * * *

SEQUENCE LISTING

```
<160> NUMBER OF SEQ ID NOS: 13

<210> SEQ ID NO 1
<211> LENGTH: 3099
<212> TYPE: DNA
<213> ORGANISM: Mus musculus
<220> FEATURE:
<221> NAME/KEY: CDS
<222> LOCATION: (167)..(1225)

<400> SEQUENCE: 1
acagcagaac tgactggtga cacctgcaca gttagccggg catcaacgca gtacacacag      60
cgcacagtgg gctctggact caacgcttca ccgatcctca gtcgctgcag acctggacct     120
tgctctctct gccttcacaa gaggatctag gcttccaagg agcaag atg acg gcc       175
                                                    Met Thr Ala
                                                      1
```

-continued

| | | |
|---|---|---|
| cac ttg cca caa gag atc tcc agc agg tgt agc act acc aac atc atg<br>His Leu Pro Gln Glu Ile Ser Ser Arg Cys Ser Thr Thr Asn Ile Met<br>    5                        10                      15 | 223 |
| gaa ccc cac tcc cgg aga cag cag gat gga gaa gag aag atg ccc ctc<br>Glu Pro His Ser Arg Arg Gln Gln Asp Gly Glu Glu Lys Met Pro Leu<br>20                      25                    30                  35 | 271 |
| cag gca gaa gat atc cgg cct gaa ata aaa gat gat ctg tat gac ccc<br>Gln Ala Glu Asp Ile Arg Pro Glu Ile Lys Asp Asp Leu Tyr Asp Pro<br>                40                    45                    50 | 319 |
| agc tac cag gat gag gag gga ccc ccg ccc aag ctg gag tac gtc tgg<br>Ser Tyr Gln Asp Glu Glu Gly Pro Pro Pro Lys Leu Glu Tyr Val Trp<br>                55                    60                    65 | 367 |
| agg aac atc atc ttc atg gcc ctg ctg cac gtg gga gcc ctg tac ggg<br>Arg Asn Ile Ile Phe Met Ala Leu Leu His Val Gly Ala Leu Tyr Gly<br>       70                      75                    80 | 415 |
| atc aca ctg gtt ccc tcc tgc aag gtc tac acc tgg ctc ttg gga gta<br>Ile Thr Leu Val Pro Ser Cys Lys Val Tyr Thr Trp Leu Leu Gly Val<br>85                      90                    95 | 463 |
| ttc tac aac gtg gtt gcc ggt ttg ggc atc aca gcc gga gcg cat cgc<br>Phe Tyr Asn Val Val Ala Gly Leu Gly Ile Thr Ala Gly Ala His Arg<br>100                     105                 110                115 | 511 |
| ttg tgg agc cac cga acc tat aaa gca agg ctg ccc cta cgc atc ttc<br>Leu Trp Ser His Arg Thr Tyr Lys Ala Arg Leu Pro Leu Arg Ile Phe<br>                120                 125                130 | 559 |
| ctc atc atg gcc aat acc atg gct ttc cag aat gac gtg tat gaa tgg<br>Leu Ile Met Ala Asn Thr Met Ala Phe Gln Asn Asp Val Tyr Glu Trp<br>             135                 140                145 | 607 |
| gcc cga gat cac cgc gcc cac cac aag ttc tca gaa aca cac gcc gac<br>Ala Arg Asp His Arg Ala His His Lys Phe Ser Glu Thr His Ala Asp<br>           150                 155                160 | 655 |
| cct cac aat tcc cgc cgt ggc ttc ttc ttc tct cac gtg ggt tgg ctg<br>Pro His Asn Ser Arg Arg Gly Phe Phe Phe Ser His Val Gly Trp Leu<br>165                   170                 175 | 703 |
| ctt gtg cgc aaa cat ccg gct gtc aaa gag aag ggc aaa aac ctg gac<br>Leu Val Arg Lys His Pro Ala Val Lys Glu Lys Gly Lys Asn Leu Asp<br>180                   185                 190                195 | 751 |
| atg tct gac ctg aaa gcc gag aag ctg gtg atg ttc cag agg agg tac<br>Met Ser Asp Leu Lys Ala Glu Lys Leu Val Met Phe Gln Arg Arg Tyr<br>                200                 205                210 | 799 |
| tac aag cta gct gtc acg ctc atg ttc atc att ctg ccc aca ctg gta<br>Tyr Lys Leu Ala Val Thr Leu Met Phe Ile Ile Leu Pro Thr Leu Val<br>             215                 220                225 | 847 |
| ccc tgg tac ttg tgg ggt gag act ttt caa cac agc tta tgc gtc tcg<br>Pro Trp Tyr Leu Trp Gly Glu Thr Phe Gln His Ser Leu Cys Val Ser<br>           230                 235                240 | 895 |
| aat ttc ctg cgg tat gct gtg ctt cta aac ttc act tgg ctg gtg aac<br>Asn Phe Leu Arg Tyr Ala Val Leu Leu Asn Phe Thr Trp Leu Val Asn<br>245                   250                 255 | 943 |
| agt gcg gcc cac ctc tac gga tac cgg ccc tat gac agg ggc att ggt<br>Ser Ala Ala His Leu Tyr Gly Tyr Arg Pro Tyr Asp Arg Gly Ile Gly<br>260                   265                 270                275 | 991 |
| gcc cgg gag aat ccc ttc gtt tca atg gca tct tta ggc gag ggc ttc<br>Ala Arg Glu Asn Pro Phe Val Ser Met Ala Ser Leu Gly Glu Gly Phe<br>                280                 285                290 | 1039 |
| cac aac tac cat cac acg ttc ccc tac gat tac tct gtc agt gag tac<br>His Asn Tyr His His Thr Phe Pro Tyr Asp Tyr Ser Val Ser Glu Tyr<br>             295                 300                305 | 1087 |
| cgc tgg cac atc aac ttc acc acg ttt ttc atc gac tgc atg gct gcc<br>Arg Trp His Ile Asn Phe Thr Thr Phe Phe Ile Asp Cys Met Ala Ala<br>           310                 315                320 | 1135 |

-continued

| | | |
|---|---|---|
| ctg ggc ctg gct tac gac cgg aag aaa gta tct aag gcc gtt gtc tta<br>Leu Gly Leu Ala Tyr Asp Arg Lys Lys Val Ser Lys Ala Val Val Leu<br>325                          330                        335 | | 1183 |
| gcc agg att aag aga act gga gat ggg agt cac aag agt agc<br>Ala Arg Ile Lys Arg Thr Gly Asp Gly Ser His Lys Ser Ser<br>340                          345                        350 | | 1225 |
| tgagtgtggg gtcatctggg tctctgttcc ataaaacaac tgggccaaca tttaattttc | | 1285 |
| tgttaactac tgaataatgc taccaaagcc ctctcctgaa cttttttttt taggggagg | | 1345 |
| ggagggtaca tggtctctct gtctctctgt cttgtctgta tctctgtgtc tctgtgtctg | | 1405 |
| tctctgtctc tctctctcta gtctatacta tagaccaggc tggcttcgaa ctcacagaga | | 1465 |
| tcttcctgcc tccgcctccc aattgttggg attaaagggg tgtatcactg tgcccagctc | | 1525 |
| tgcgaagtct tgtcaaatgt tcaaggcaac tctcctttat gaccccttg tcctctagtc | | 1585 |
| ccatccccac ccttcgttcc tactatgctt gtctttcttt tctccttctc taagaagcag | | 1645 |
| ccagtgagtg cttggccaac ctccccaagg cttcacagcc tttctgttgt ctcaaagtaa | | 1705 |
| ggaccttcat catggacagt tctctgccta ggtatctgtc taaagctatc agtacaacaa | | 1765 |
| aaccttttag ggaatgtctt cttaattgcc gttagttcat gcttttctga agaaaagggg | | 1825 |
| gaaaatagca tcagttgtca tagaagtgct aaaggtggag aatcctcagg tgggaaagca | | 1885 |
| tgcagagtat gactcagaag caggggggacc atcaaggtag gaagtgactc agtagggagt | | 1945 |
| actcaccaaa ataagacctc ccacagacag agcccagaca cagagcagga aacggccgtt | | 2005 |
| gaaagtggcc atgctagaac acaatagaat gtctctgcag ctcagtctgg tccaagccag | | 2065 |
| aagtaaagga aaaacaattc agttagtagg aaaagagatt tctcctgaga cagggttttt | | 2125 |
| gtttgtttgt ttgtttgttt gttgttgttt tctgtattga caaggaacat tgttatgcca | | 2185 |
| cagaacaaga aggcttcggc ttggttaaaa aaaaacagaa aactcataga ttccacaagc | | 2245 |
| tacacatcca atctgtttta cacttctctt ctgcctgcct tgcgttgtca atgttattta | | 2305 |
| tgttctgctc tcatagtgat tgggtaacta tagcaacccc aaacatccca actggaagga | | 2365 |
| ttgtaggcaa agttgggtca aacctaaaat catgtagacg attgtttaga gcagggaggg | | 2425 |
| aggtgtttca ctgagtcctc tgagaaggtt ccagaagctt tagaacagag ggttacttgg | | 2485 |
| gtttcctgta gctcccaccc ctgagaagag agggaagtct gatggccagt atcagtagtc | | 2545 |
| acttcagaag aaatagcttt gcaaagagag agagctctga gaacacattg tgctgtgggg | | 2605 |
| gctccagaag ttactgagtt actaagtatt gagagagtag caaactcagt gctccaaggt | | 2665 |
| atgctagtca taaaacagag agcgacattc ctccacccac cgcttcctgg gttcaaggag | | 2725 |
| tgttcattca agaaagtcac cctgacccac cctgaccatt gctggaaccc gctatgcaaa | | 2785 |
| ggtgctattg ttaggggctc ttagaaactg tcttgagaaa taaccctcac aattaccagg | | 2845 |
| tattccttgt gacacctgtg actttgtact tccttgtgac tcttgactgg tatttttggt | | 2905 |
| attttccaac aacgcccttc ccacctcctt gagttgtggt ttcttccttt aaatacccc | | 2965 |
| ttatccagct acttggggtg ccccccttatc cagctacttg gggtacttgg ggtacttgta | | 3025 |
| tgatcgtgga cccgagagcg ctcttgaata aaaaaatcct cttgcaaaaa aaaaaaaaa | | 3085 |
| aaaaaaaaaa aaaa | | 3099 |

<210> SEQ ID NO 2
<211> LENGTH: 353
<212> TYPE: PRT
<213> ORGANISM: Mus musculus

```
<400> SEQUENCE: 2

Met Thr Ala His Leu Pro Gln Glu Ile Ser Ser Arg Cys Ser Thr Thr
1               5                   10                  15

Asn Ile Met Glu Pro His Ser Arg Arg Gln Gln Asp Gly Glu Glu Lys
            20                  25                  30

Met Pro Leu Gln Ala Glu Asp Ile Arg Pro Glu Ile Lys Asp Asp Leu
        35                  40                  45

Tyr Asp Pro Ser Tyr Gln Asp Glu Glu Gly Pro Pro Lys Leu Glu
    50                  55                  60

Tyr Val Trp Arg Asn Ile Ile Phe Met Ala Leu Leu His Val Gly Ala
65                  70                  75                  80

Leu Tyr Gly Ile Thr Leu Val Pro Ser Cys Lys Val Tyr Thr Trp Leu
            85                  90                  95

Leu Gly Val Phe Tyr Asn Val Val Ala Gly Leu Gly Ile Thr Ala Gly
            100                 105                 110

Ala His Arg Leu Trp Ser His Arg Thr Tyr Lys Ala Arg Leu Pro Leu
            115                 120                 125

Arg Ile Phe Leu Ile Met Ala Asn Thr Met Ala Phe Gln Asn Asp Val
130                 135                 140

Tyr Glu Trp Ala Arg Asp His Arg Ala His His Lys Phe Ser Glu Thr
145                 150                 155                 160

His Ala Asp Pro His Asn Ser Arg Arg Gly Phe Phe Phe Ser His Val
                165                 170                 175

Gly Trp Leu Leu Val Arg Lys His Pro Ala Val Lys Glu Lys Gly Lys
            180                 185                 190

Asn Leu Asp Met Ser Asp Leu Lys Ala Glu Lys Leu Val Met Phe Gln
            195                 200                 205

Arg Arg Tyr Tyr Lys Leu Ala Val Thr Leu Met Phe Ile Ile Leu Pro
210                 215                 220

Thr Leu Val Pro Trp Tyr Leu Trp Gly Glu Thr Phe Gln His Ser Leu
225                 230                 235                 240

Cys Val Ser Asn Phe Leu Arg Tyr Ala Val Leu Leu Asn Phe Thr Trp
                245                 250                 255

Leu Val Asn Ser Ala Ala His Leu Tyr Gly Tyr Arg Pro Tyr Asp Arg
            260                 265                 270

Gly Ile Gly Ala Arg Glu Asn Pro Phe Val Ser Met Ala Ser Leu Gly
            275                 280                 285

Glu Gly Phe His Asn Tyr His His Thr Phe Pro Tyr Asp Tyr Ser Val
    290                 295                 300

Ser Glu Tyr Arg Trp His Ile Asn Phe Thr Thr Phe Phe Ile Asp Cys
305                 310                 315                 320

Met Ala Ala Leu Gly Leu Ala Tyr Asp Arg Lys Lys Val Ser Lys Ala
                325                 330                 335

Val Val Leu Ala Arg Ile Lys Arg Thr Gly Asp Gly Ser His Lys Ser
            340                 345                 350

Ser

<210> SEQ ID NO 3
<211> LENGTH: 10166
<212> TYPE: DNA
<213> ORGANISM: Mus musculus

<400> SEQUENCE: 3
agtgtttttt tatcttatat tatagctaga aaaatggaaa ttctttgatt ggtctaaatc    60
```

```
tataagactc atgtagccac ttcattgggt tttttactgg tcttagaggt gtaatatact      120
ctgcgtgtct tcatcacaag agtattagct tataagttat tgggtatgat caaaaaggtg      180
taacactggt tactagaaag ttagcttaaa gttggtaact caggtttgga gtctttcaaa      240
catgttgcat aaagcaggcc aaaaaactag gcctctaagg atacttctag ttgagataat      300
atttaatgtg gattcttatc ctaaaaggta gacttaaaga taagatttaa agcaatgtct      360
ctttaatgaa gcattaaaac ttgcactgtc atgcattcat aggtataaat tggcagccaa      420
attttgtaat gtgatagtga tgtttctaac attgattcta aggttataaa ttgttttgaa      480
attgggtttt gctttcccaa ggttgtagat attattctaa tgttgcaaaa gaaacttaaa      540
aatcatggtt aaaattgcca gtgttctatt gactgcagct tgcagtttga tcacaagctt      600
aagattttaa actcacccat atattgttaa ttaagattat tacaagagta atcattgaga      660
cgggtgtggt ggcacacgcc ttttatccca gcacttggga ggcagaggca ggaggatttc      720
tgagttcgag gtaagcctgg tctacaaagt gagttccagg acagccaggg ctatatagag      780
aaaccctgtc tcgaaaaaca aaaaacaaa acaaaacaaa aaaaaaaaag agtaatcatc       840
ttatgagagc gctacaaaac taagacagag ttatctagat atgtttgttt ttgtacataa      900
attagaccct cagacagtag attttgctta tggttgctgc ctggcaggag actacagtac      960
aggcaatttt ttttttttt tttttttta cagcaccaaa gttataaagt aagttttaag       1020
tataagtcat tttaagaaag actatccaaa attagaggca tggacagttg aattgttttcc    1080 ccagaatttg tcctcattgc aggagggcca agatgctcag attaaaaaaa attttatgtt     1140
ttgagttaat gcaaagttcg agcagcctct gcggggtggg gtggagggt gggggggtgg      1200 gtgtgtgtgt gactttcttt tgttttgcaa acagtgcctg gggaagttct tgccagcctt     1260
caggggaatt tctaaaagaa cactgttgca gatctatcca gatgttgttc taaataaagt     1320
tctaattcaa agtttataaa gggtcaatca ggctgtagaa tttatcaaga cattacagtt    1380
tgacttgcct acttcatgta aagttattat aggcttaaaa gtttgttttt tcctttgaat    1440
tctgataatt ataagagtt ttgcttctag tgaactggta atcactggaa aattttgcct     1500
ctaggtatgg ctaatatagc tttacattat gtaagaaaaa attttattg cctctgcttc     1560 tatataagaa gctaagagct tgaattttc agtgtatatt gtttcctaag tggaaagtat     1620
tttaaagcta atggctctca agggaagttt actttaaatc tttgctctca tacaatgagc    1680
tttaaagttc tggggagtag ctgttgctcc agaaaagatt cagaggcaat atctttttaa    1740
tatttagggt tttagttata ctataaaatt ttggtacaga aaatctaaga acgaaaaatt    1800
gatttgcttc aaaattttat tttcaaaagc ttccaggaga tgttaattgg ctaagacctc     1860
accttaaact caccacagga gaacttaagc ctttgttagg tgctattaag tgagacacaa    1920
atgaactggc aaagaacaaa aggctttgca gaaaataaag aaagctttta taattgttat    1980
caattataat caatagtaat taaatattag ctgcttattt tagttatggt tattaaatgt    2040
gcccacagca attctttggc aagagaaaaa tttaatgtaa aatcatcttt ctttgcctca    2100
aagtaaagtt ttaacatcct tttaaggctg ctgtggtgct aataaagaat tgtaagataa    2160
ctttgtgtat tttagaaaac ctataacaaa aaattgtgtc ttaagaacct gacaagtgt     2220 ctgttccttg ttccaatagc aattaatttg gttattgcag aatattgata tttggcctat    2280
tgcacaccat catttaaaat aaaattgata atcattatcc taaagataag ttaaaaattg    2340 ttttttatgca tgcttttgta ccttctataa atccatgcat gtatgcatcc catttactgt   2400
```

```
gtttaaaaac agcccttcta tgggagaaaa gtatatgtga attggatcac acgcttattc    2460
ttttgagttt cttcctgctt cagcatagat aattaaattg tgtgctgtag atggtgtttt    2520
aaaatgttga ataatcaagc tttaatttgt atgttaatta tcaatgtata tctcagagct    2580
tacaattgct taaaattgtt cttctctcag atactataaa ttctcaaatt tgcaatggtt    2640
tatgcataca taactcataa gaaaaaatgc tgctctttta agaagactgt ttttggacat    2700
ttaataaaat tttctggatt gtctggacaa gaccccttaa ggcaatgcca tgctagattt    2760
atatctcagg cagatacagg ccttacataa gaataatctc attctttatt taatcaaaac    2820
agtaatggtt taagataata ttttggtatt tttagagaag gtgcatatca aattgtgaaa    2880
gagttgttct tggtgtcctc aattcctacc tgtttccaca taatggcggg accattagct    2940
aatacgtgga atggttcccg tcttaatatt ggggaagaga gggagtgctt ctgttttttc    3000
cacagaatgc tgcaggagta tgctagcttc caatgtgaca ggctgacctg tgggttcctg    3060
agcaccctga cagtggttac aggaaagctg tattgagcgc acagaggagg aggaaattgg    3120
agagcagcca tttgcaaaca agatgaagaa acttcctatc cccgccatgg gctacagcaa    3180
ggagagctga cctggtgtca acttggggac aactaaaaat gatgactcgt gaggcagagg    3240
gactgctaca gagtattgga caagatttcg tcagagacac tgttttttggc cattcaggcc    3300 aactccccta tagctgtaaa aacttgtgta ccttacctgt atgctataat gttagataat    3360
tttaagagtt aagatcacca atcttggcaa gtcttttcat attcattgta attcttgtca    3420
aataactaat tgtgtagatc ctaatttaga taagaaatct gctgttatga ttttgttaaa    3480
gagatctgct tatgttttgc tgccaattag agttaggaaa tgatccttgg tttaaaaatc    3540
tgggaatgca aactttgaaa aggtatctac cacagctttta gatcagcagc tgcatactgc    3600
tcattttgtt aatgataagc ataggaatat ttccatagcc ttgtcaaagc tgcatattat    3660
agataaaaat tggaggcaaa ggttaatgtc ttagaagtag tagtcttagc aatagggcag    3720
gacatagcat atattaaggc tagaaaggca gaaatttcag atattagcaa aagtcacttg    3780
gacacttgga acattgatga attggccaga gattaaaaca acagcaacaa caacaacaac    3840
aacaacaaca acaacaacaa caaactaagt gcattgaatc ccctggattg ggttcaatat    3900
ataatcctac ttgctactat tattggcatt attttcttag taatcattgt gtttccactc    3960
atctttagag cactcttgag atctgtagct acgatgaggt gggacattcc ggaacttcgg    4020
cagaaatata aaaagatag ggaagaatg ctacacacac tccagtgaag tttgcttggc    4080
aggcttagag gcctgggagc actcacgagg caaagagttt cacggaaact cacctcctgg    4140
aactttggcg tcctcataac ctgtacccta tccccataac tcatacccta tcctcgagtt    4200
agtctggtgt atggatccac gtgctctctt ttagtattat tttattataa gtgccttta    4260 agattgaatt ctgacatagc taagccttg ccagtgttac aatgttccag aaaacccttg    4320
aagccaacaa actgggaatt cagtaggaat tcagtgagaa ggttaggtaa cattcaagtt    4380
tacttctagt agagacagtg aaactaatga ggcattacac agaacgagat agaatagctc    4440
agggctagtc tgcagagtga tcacttggga cagtagccag tcttacccag acaagggaat    4500
tcaccagggc ctagcgatta ggtgggttta ccatgagaaa gctagggaat ctcactgaga    4560 caggttctt cattaggccc aaagaaatca ggcaggacta tggagcataa aattttttt    4620 atgctgaaaa agtaaaacgt aaaaacaaaa ttctaggcct ttgggagtgt ggcctttgtg    4680
gctcagtgct ccgaggtgtg ctggtcataa aacagatagc aacattcctc caccacctgc    4740
ttcctgggtt caaagagtgt taattcaaag aatgtgctat tgttagggc tcttagaaac    4800
```

```
tgtcttgaga aataaccctc acaattacca ggtattcctc gtgactcttg tgactttgca   4860
cttccttgtg actcttaact ggtattttig gtattttcca acaatgccct ccccacttcc   4920
ttgagttgtg gtttctccct ttaaatacce ccttatccag ctactcgggg caccacggtc   4980
ctctacccct gcgtggtgta tgatcgtgga cctgagagcg ctcttgaata aaaatcctct   5040
tgcagtttgc agcaagaccg tttcttgtgg gtgattttgg ggtgttgcct ctcctgagtc   5100
agaacatggg ggagtcctca cgttgtgagt cttcaatgc cttggtccag ctattttat    5160 tatataatca gggaggaagc aggctgatcc agactttgac cttgcagcca ctaagaagga   5220
gattacctag ggggtagcct tccgacctag atggctctat ggttctgtca cctgtcactg   5280
ctctcctcaa agacactgct acctgctgag aggcccctga ggcattctga ggaacatcct   5340
atcctgcaca ggctggctcc agacaccaag aatgaactgg cgggggatgg gacttccccc   5400
ttataagcac actctcttag taaactcgtg ggccttacac agaattgtgt cttggtctcc   5460
attatctctc tcaccgtcta agtcttttc agccccaaac tgcctcccag gtgtacctgg    5520
ttcaagtagg ctgtgggccg gcatacaaca aagaacattt gtttctcttg aaaagcctg    5580 gagtttggtt tccagcaccc atgtaacagt tcataaccat ctgtaactcc agttccaaag   5640
gatcctgtgc attctttcgg cttccatgca cactgtacac acatgtagtg catagacata   5700
catgtgagga aacactcata ctcataaact aaaaataaac acaactttaa cataattaaa   5760
atttaaatgt ccattttgc tttgttgtat cacagagaag agaattgtgt agatcaaagc     5820
caaaggcagg atgtgagtag gaaaagaaaa atcggataat ttgtgcttca gtaaaacttg   5880
aaatagttgt gcttccaaaa gagactaaaa gaaagtgaaa ggagccaagc agtgatggtg   5940 cacacccttta attccagcac tggggaagca gaggcaggtg gatctctgtg agttcaaggc  6000
cagcctgatc tgctgatctt ctaattttgt cttccagttt ccttggttat gtcatagact   6060
tcctttcaat cagagccaat agcatagcta atgaaggaaa gggggagtta ttgtagattt   6120
cataagtgaa gggtaatatt atgtataaaa ggccatagct gaaagtgcct ttgtcccttta  6180 tccccaggga gggggacaaa gtgaagtgaa aaggtgtctg tgtgtgtatc tgtgtgtgtc   6240
cttgactgcc cttcaccttg gttttgaaac agtcttttat tgagcctggt gctcacagat   6300
tggcttgctt ggctggcagg ccacacaccc cagcatcctt ctccctcttt cccaggcttt   6360
catggtctgg gagtagaggc ctgccctatc ccttcttgtt ttgtatgtgg gtgctggagg   6420
tctggactca ggtcctcatg tttatccact gagctatgtg cccagcccct agttgatttt   6480
ttttaaactt tgatgaataa ttaacttagc ctacgtgtct ccattgccgg ctgcttctac   6540
cctccatggt tgtctgactt ccatgtgtta ggtgaaaaac tgaaaatgca tgtataaaat   6600
gagccaagga aacttcagtt cagaccagat gtcctttacc tgccttttgt gtacctgagt   6660
ggctcacaga ttctcacaaa gatcccaaat tctaaagata ggcatcccca ccctataagg   6720
ctgtaggctg tataactggg tcatactcaa accccggtct gaggtcctgc tcttttaca   6780 gaccctggat cattttagtt cagtgttctt gaaaaggaag gatgttgatt gtaaagatct   6840
ttcaaaacgt acacatgcag gctctaggtt caagtgttct gttccctcac tgagagcatc  6900
cctcagtgtg tgagaatttt tagcttagac cttigtgtaa atatgatgaa aacggatttt   6960
gtttgttgtt gttttgagat agattctcaa ctctgtagct ctgactggct ggggactcat   7020
tgagtagacc aggctggcct caaagtcata gaaacccaac tgcctctgcc tcccaagtgc   7080
tgaaaaggat tttaatttttt gttttgaaa cagagtctgg cttcatcacc caggatgtcc    7140
```

-continued

```
tcaagttggt catcctcctt cagcctccca aatgctggga ttaggcctga cgacatgtga    7200
gactgaattg tctgacctat ttgcccatca tctatctcca actgtgtgtt ggagtgtcgg    7260
aaggctcttt ccttaaaaca aaacccatga aatccccagc tactctagct gaggcagagg    7320
ggttcgatgt tccaagccag cctgagctac atagtgaaac ctttcaagaa acaacccagg    7380
gctgagaaat gtagctcagt ggtacagcac ttgcctggta tgtaccaggt tatgaatttg    7440
atcccccata gagccaaaag tacacaaaaa caagacacaa aaatctgccc tgacgaaagt    7500
cactgaagaa aacagtttct tgggagcgga aatctctgga tgatagatgc acacatttga    7560
tcttattggg tgccgataga ttgttcttta gaacagttgg gcaacttcca ggctcataag    7620
tgcccttcga gtctccattt ctctgcttcc tagccagccg tagataatgc catgcctact    7680
tttacaactg cagtaggggg ttcctctagc tcgcatttac gaatttcatt tcaagcaaat    7740
cacagtcccc actggtccct tctcagatcc cgtaacttat ctctcttctg ggaagtgatc    7800
actgaataat taatgtctgt aagaaattct ataatgcact agagaaacca aggaaaggtc    7860
aggcagggct cctgccatga ggaggcttat ggtttacccg tgagatggac ttgcaaactg    7920 gttttttggtt ttttggtttt tttggttttt tggttttttg gttttttggt ttttttgttt    7980
ttttttggtt ttttggtttt ttggttttttt ggttttttgt tttttttggt tttttttggt    8040
tttttggttt tttggttttt tggttttttg gtttttggt ttttggttt tttggttttt    8100 tggtttttttg gtttttttgg ttttttggttt tttggttttt tggttttttg gttttttggt    8160
tttttggttt tttggttttt tggtttttttt gttttttggt tttggtttg    8220 tttttccaga caaggtttct gtctatagtc ctggctgtcc tggaacttgc ttggtagacc    8280
aggctggcct caaactcata gagatccacc tgcctctgcc tcccaagtgc tgggatgaaa    8340
aatgtacacc accatgccca gtgcaaacaa gtctcaatat ggctgttaaa ataaaattgt    8400
ggggtcaaag caaagcaaag tatgtgggga gccaaaagga ctgtggggtc cctcgctgtt    8460
tgataagagg ggaagaggat ggagaggcca aggaagcttt cacagaggga caagttggtc    8520
atgcttgccc tcatatagtc tccttttgtgt gtgtgtgggg gggaagtgta caggggagat    8580
gtctatctca ggagaccta gtgaatgcaa atccctgcag tttgagcttc ctcatcctgc    8640
tgtgaatcta ctgaagacgg cctgtgaagt cattttgtct tgggactcta ggccagcatc    8700
gctttccgag cagggtttga gcctgggctc tggcatcttg cctactatga tcagtttcta    8760
gctctgtgag tcactggctc ctgggaccac agacaaatta tctgagctct ctatatctca    8820
acttccttct ccttaaaaac cacaggtcat gggtcacggg gagactttt aaaaagttag    8880 tattagcttt tttttttttt ttttaaagtc attccatacc agctcagtct tcttatttca    8940
caggcaaacc tttgcacctc tgctgcctgt aaacgcctgt ctgaggttcc cacttttttcc    9000 ttatagaaga ctcccaattc ccaacctgat gggagaatct tcagacctcc ctgcctgcag    9060
cagatgttcc gggggcagga acataggaa gtaattaaat gctaatgtct ggaggtggtt    9120
atcccctgtg aaacgagtcc tatgactgag cgtgggctca gacactcagc cctgtgcgtg    9180
tgactgtgtg tgtgagctgg tcagagcatt ctgcgattct gctgaacatc ctgggcaggt    9240
gggtggggaa gagccgccac tggcttgaga tgctaagtaa aaggcgggc tatgcacctg    9300 ctcttgtctc gagatctggg ggtggaggcc agtccacccc cccttacccc caccacacct    9360
gatgagtgga aagagaaggt ggaattgtgg tggacactga tgagctgtcc ccactgtgca    9420
actgccccag tgtgacacat ttgccaagca cctgtgttag tcctgggctt gaacttgact    9480
ctcacccccc agattcactc ttttcccact ttgtggacat tttctaccct ctatgaagct    9540
```

```
tgagaactgg accccagatt cctccagtca tgatgctggc agagacccag ggtccacaga      9600
gatgaaaccg aggaggttgg cacagagggc tgtctgccag cgagatagca gatttctgga      9660
tgccagagcc aggaagacaa gagagtaaca aattcctctg ctcagagctt gccagagtgc      9720
tgagaatact ccatctgtct aggaatgggg acaaaggtgg ctctctctta gtgtgtgcag      9780
catcccatag ccttgcctta ggtgaatgtg ggctttgctg gctgtcctcc cctctctcgc      9840
cttcagtctt tatctcctca tggggctgcc ttgactagcc agctctgaat tctttatccc      9900
ttgttggcag tcatgaagca catctgaaca aataccagac acagtcacca agtgccagct      9960
ctacataccc tttaaatcct gtgcctggaa acaacaacac acagcagaac tgactggtga     10020
cacctgcaca gttagccggg catcaacgca gtacacacag cgcacagtgg gctctggact     10080
caacgcttca ccgatcctca gtcgctgcag acctggacct tgctctctct gccttcacaa     10140
gaggatctag gcttccaagg agcaag                                          10166
```

```
<210> SEQ ID NO 4
<211> LENGTH: 28
<212> TYPE: DNA
<213> ORGANISM: Artificial
<220> FEATURE:
<223> OTHER INFORMATION: Synthetic oligonucleotide

<400> SEQUENCE: 4
tcctgctgtc tccgggagtg gggttcca                                            28

<210> SEQ ID NO 5
<211> LENGTH: 28
<212> TYPE: DNA
<213> ORGANISM: Artificial
<220> FEATURE:
<223> OTHER INFORMATION: Synthetic oligonucleotide

<400> SEQUENCE: 5
ttggccaacc tccccaaggc ttcacagc                                            28

<210> SEQ ID NO 6
<211> LENGTH: 35
<212> TYPE: DNA
<213> ORGANISM: Artificial
<220> FEATURE:
<223> OTHER INFORMATION: Synthetic oligonucleotide

<400> SEQUENCE: 6
acagcagaac tgactggtga cacctgcaca gttag                                    35

<210> SEQ ID NO 7
<211> LENGTH: 34
<212> TYPE: DNA
<213> ORGANISM: Artificial
<220> FEATURE:
<223> OTHER INFORMATION: Synthetic oligonucleotide

<400> SEQUENCE: 7
ccgagagcgc tcttgaataa aaaaatcctc ttgc                                     34

<210> SEQ ID NO 8
<211> LENGTH: 22
<212> TYPE: DNA
<213> ORGANISM: Artificial
<220> FEATURE:
<223> OTHER INFORMATION: Synthetic oligonucleotide
```

-continued

```
<400> SEQUENCE: 8
aggatggaga agagaagatg cc                                      22

<210> SEQ ID NO 9
<211> LENGTH: 24
<212> TYPE: DNA
<213> ORGANISM: Artificial
<220> FEATURE:
<223> OTHER INFORMATION: Synthetic oligonucleotide

<400> SEQUENCE: 9
agttgtttta tggaacagag accc                                    24

<210> SEQ ID NO 10
<211> LENGTH: 21
<212> TYPE: DNA
<213> ORGANISM: Artificial
<220> FEATURE:
<223> OTHER INFORMATION: Synthetic oligonucleotide

<400> SEQUENCE: 10
gctctctctg ccttcacaag a                                       21

<210> SEQ ID NO 11
<211> LENGTH: 25
<212> TYPE: DNA
<213> ORGANISM: Artificial
<220> FEATURE:
<223> OTHER INFORMATION: Synthetic oligonucleotide

<400> SEQUENCE: 11
tgttcctcca gacgtactcc agctt                                   25

<210> SEQ ID NO 12
<211> LENGTH: 60
<212> TYPE: DNA
<213> ORGANISM: Artificial
<220> FEATURE:
<223> OTHER INFORMATION: Synthetic oligonucleotide

<400> SEQUENCE: 12
ttgaattcac catgtaccca tatgacgtcc cggactacgc catgacggcc cacttgccac   60

<210> SEQ ID NO 13
<211> LENGTH: 30
<212> TYPE: DNA
<213> ORGANISM: Artificial
<220> FEATURE:
<223> OTHER INFORMATION: Synthetic oligonucleotide

<400> SEQUENCE: 13
ttgctcgagt cagctactct tgtgactccc                              30
```